United States Patent
Lin

(10) Patent No.: US 9,063,373 B2
(45) Date of Patent: Jun. 23, 2015

(54) LIGHT EMITTING DIODE MODULE AND LIGHT BAR HAVING THE SAME

(71) Applicant: HON HAI PRECISION INDUSTRY CO., LTD., New Taipei (TW)

(72) Inventor: I-Thun Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/049,219

(22) Filed: Oct. 9, 2013

(65) Prior Publication Data
US 2014/0168568 A1    Jun. 19, 2014

(30) Foreign Application Priority Data
Dec. 19, 2012   (TW) .............................. 101148533 A

(51) Int. Cl.
*G02F 1/1335* (2006.01)
*H01L 33/58* (2010.01)
*H01L 33/46* (2010.01)
*H01L 33/48* (2010.01)

(52) U.S. Cl.
CPC ........... *G02F 1/133603* (2013.01); *H01L 33/46* (2013.01); *H01L 33/486* (2013.01); *H01L 33/58* (2013.01); *H01L 2924/0002* (2013.01)

(58) Field of Classification Search
CPC ....................... G02F 1/133603; G02B 6/0073
USPC .............................................. 349/62; 362/612
See application file for complete search history.

(56) References Cited

U.S. PATENT DOCUMENTS

| | | | | |
|---|---|---|---|---|
| 2008/0100773 | A1* | 5/2008 | Hwang et al. | 349/62 |
| 2008/0278655 | A1* | 11/2008 | Moon et al. | 349/58 |
| 2010/0309683 | A1* | 12/2010 | Tsai | 362/611 |
| 2011/0199788 | A1* | 8/2011 | Park | 362/612 |

* cited by examiner

*Primary Examiner* — Than-Nhan P Nguyen
(74) *Attorney, Agent, or Firm* — Novak Druce Connolly Bove + Quigg LLP

(57) ABSTRACT

A light bar includes a printed circuit board, and light emitting diode (LED) modules adhered to the printed circuit board. Each LED module includes an LED, a frame and a lens. The frame includes a top surface and a bottom surface opposite to the top surface, the top surface being recessed towards the bottom surface to define a cavity in the frame. The LED is received in the cavity. The bottom surface of the frame is adhered to the printed circuit board. The lens is mounted on the top surface of the frame and covers the LED. A bottom surface of the lens occupies an area substantially the same as that occupied by the top surface of the frame.

12 Claims, 4 Drawing Sheets

LIGHT EMITTING DIODE MODULE AND LIGHT BAR HAVING THE SAME

BACKGROUND

1. Technical Field

The present disclosure relates to a light emitting diode (LED) module and a light bar having the LED module, the light bar being used as a direct-type backlight source for a liquid crystal display (LCD).

2. Description of Related Art

LEDs have many beneficial characteristics, including low electrical power consumption, low heat generation, long lifetime, small volume, good impact resistance, fast response and excellent stability. These characteristics have enabled LEDs to be widely used as a light source in electrical appliances and electronic devices.

A conventional LED light bar includes a printed circuit board, an LED adhered to the printed circuit board by glue and a lens adhered to the printed circuit board by glue to cover the LED. The lens adjusts light emitted from the LED to make the light evenly travel through the lens to illuminate an object, for example, a liquid crystal display (LCD). However, it is time-consuming and costly requirement to respectively adhering the LED and the lens on the printed circuit board. Further, applying glue twice on the printed circuit board in order to secure the LED and lens in position on the printed circuit board bears a risk that the glue is more likely to overflow to contaminate the components on the printed circuit board. Finally, a high positioning accuracy is required to align the optical axes of the LED and the lens, which is costly and sometimes difficult to be always obtained.

What is needed, therefore, is an improved LED module and a light bar having the LED module which overcome the above described shortcomings.

DETAILED DESCRIPTION

An embodiment of an LED module and a light bar in accordance with the present disclosure will now be described in detail below and with reference to the drawings. The light bar is used as a direct-type backlight source for a liquid crystal display (LCD).

Figure 1:
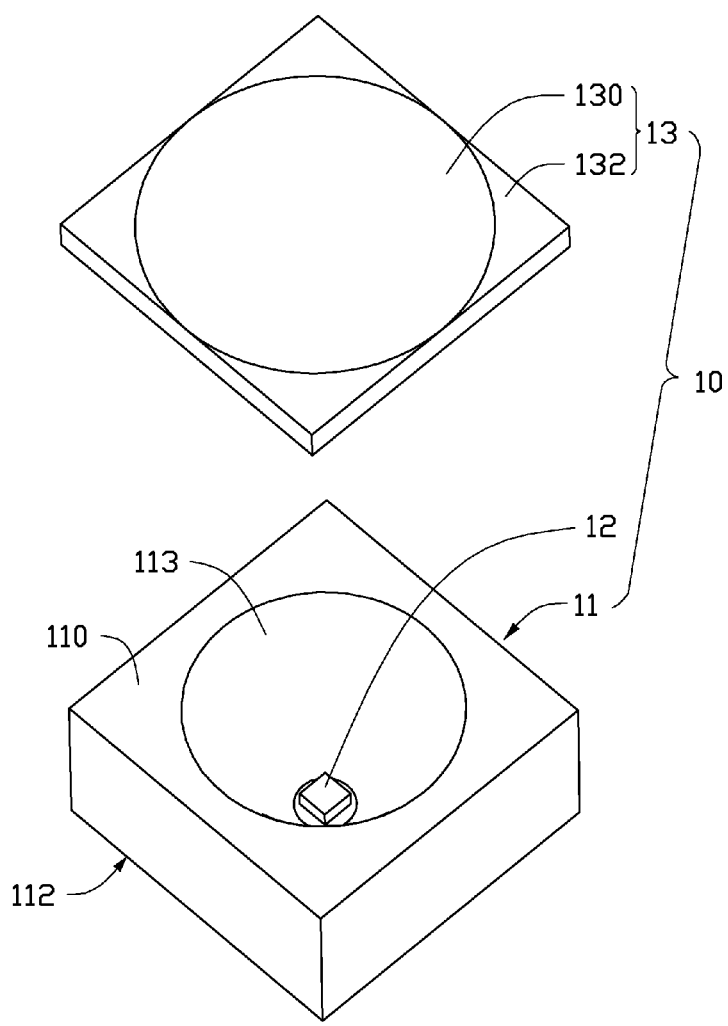
FIG. 1 is an exploded view of an LED module of an exemplary embodiment of the present disclosure.

In the description that follows, the stated orientations of all of the elements of the consumer electronic product assembly are with reference to the orientations of all of the elements as shown in FIG. 1.

Figure 2:
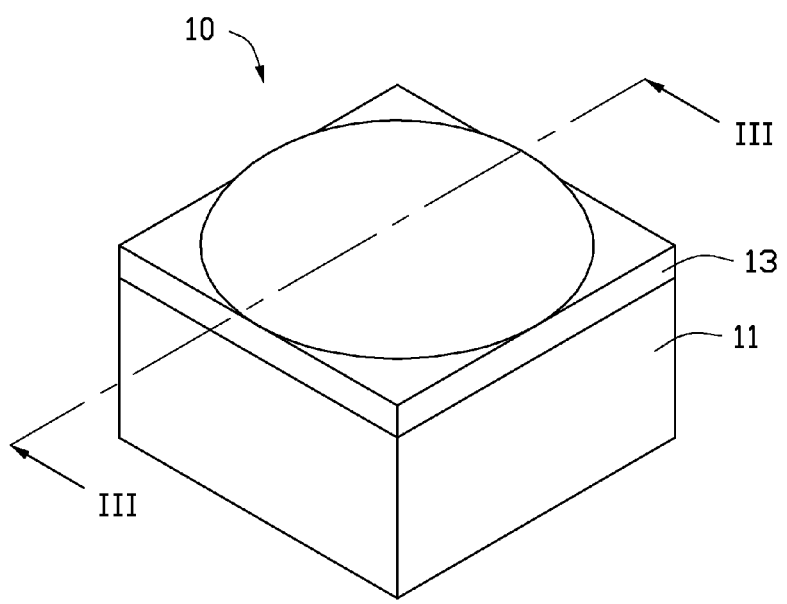
FIG. 2 is an assembled view of the LED module of FIG. 1.
Figure 3:
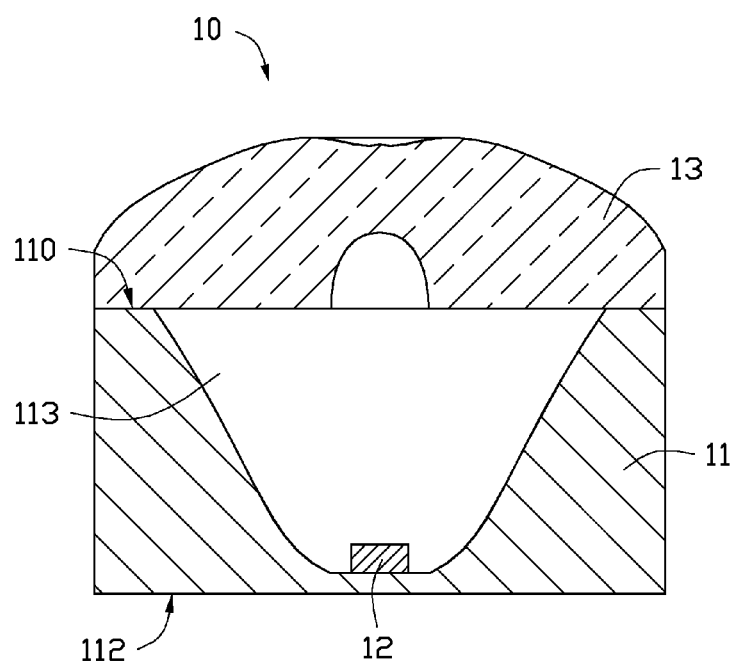
FIG. 3 is a cross-sectional view of the LED module of FIG. 2 taken along III-III line thereof.

Referring to FIGS. 1 to 3, an LED module 10 in accordance with an exemplary embodiment of the disclosure includes a frame 11, an LED 12 received in the frame 11, and a lens 13 mounted on the frame 11 to cover the LED 12.

The frame 11 includes a top surface 110 and a bottom surface 112 opposite to the top surface 110. A central portion of the top surface 110 is recessed towards the bottom surface 112 to define a cavity 113 in the frame 11. A diameter of the cavity 113 generally decreases from top to bottom. An inner surface of the frame 11 defining the cavity 113 is coated with a reflective material whereby the inner surface of the frame 11 reflects light emitting from the LED 12. Circuits (not shown) are formed on the inner surface of the frame 11 defining the cavity 13.

The LED 12 is mounted on a center of a bottom end of the cavity 13 and electrically connects with the circuit of the frame 11.

The lens 13 is mounted on the top surface 110 of the frame 11 and covers the LED 12. A bottom surface of the lens 13 occupies an area which is substantially the same as that occupied by the upper surface of the frame 11. The lens 13 includes a light adjusting portion 130 and a mounting portion 132 formed on a bottom end of the light adjusting portion 130. The light adjusting portion 130 is convex and protrudes upwardly from a central portion of the mounting portion 132. A top surface of the light adjusting portion 130 is convex and acts as a light outputting surface of the lens 13. In this embodiment, a size of the mounting portion 132 is the same that of the top surface 110 of the frame 11. The mounting portion 132 is aligned the top surface 110 and mounted on the top surface 110. The LED 12 is aligned with and faces a central part of the light adjusting portion 130.

Figure 4:
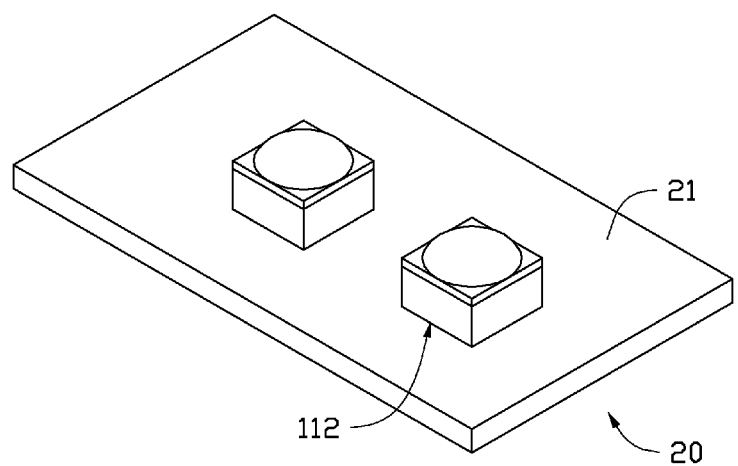
FIG. 4 is a schematic view of a light bar of an exemplary embodiment of the present disclosure.

Referring to FIG. 4, a light bar 20 of an exemplary embodiment of the present disclosure is shown. The light bar 20 includes a printed circuit board 21 and a plurality of LED modules 10 spaced from each other. The LED modules 10 which includes the LEDs 12 and the lenses 13 are adhered to the printed circuit board 21 via glue contacting the bottom surfaces 120 of the LED modules 10. The glue only needs to be applied to the printed circuit board 21 once. Therefore, it is time-saving to manufacture the light bar 20. A risk of elements of the light bar 20 contaminated by the glue is decreased.

The frame 11 may be transparent and integrally formed with the lens 13 to save the time for manufacturing the frame 11 and the lens 13 and easily control the relative position between the frame 11 and the lens 13 to enable the frame 11 and the lens 13 to precisely align with each other. Thus, the lens 30 can accurately adjust the light emitted from the LED 12. The inner surface of the cavity 113 can be coated a reflecting film to improve reflecting efficiency of the frame 11.

The frame 11 may be opaque and is made material different from that of the lens 13, whereby the lens 13 is adhered to the frame 11. Since the lens 13 is directly secured to the frame 11, alignment between the centers of the lens 13 and the frame 11 can be easily achieved to ensure that light from the LED 12 can be properly adjusted by the lens 13.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A light emitting diode (LED) module comprising:
   an LED;
   a frame comprising a top surface and a bottom surface opposite to the top surface, the top surface being recessed towards the bottom surface to define a cavity in the frame, and the LED received in the cavity; and
   a lens mounted on the top surface of the frame and covering the LED, an area occupied by a bottom surface of the lens being substantially the same as that occupied by the top surface of the frame, the lens comprising a light adjusting portion and a mounting portion formed on a bottom end of the light adjusting portion, the mounting portion aligned with the top surface and mounted on the top surface, the light adjusting portion facing the LED, a size of the mounting portion being the same as that of the top surface.

2. The LED module of claim 1, wherein the light adjusting portion is convex and protrudes upwardly from a central portion of the mounting portion.

3. The LED module of claim 2, wherein a top surface of the light adjusting portion is convex and acts as a light outputting surface of the lens.

4. The LED module of claim 1, wherein a diameter of the cavity generally decreases from top to bottom.

5. The LED module of claim 1, wherein an inner surface of the frame defining the cavity is light reflective.

6. The LED module of claim 5, wherein the inner surface of the frame defining the cavity is coated with a light reflecting material.

7. A light bar for use as a direct-type light source for liquid crystal display (LCD) comprising:

a printed circuit board; and a plurality of light emitting diode (LED) modules adhered to the printed circuit board, and each LED module comprising:

an LED;

a frame comprising a top surface and a bottom surface opposite to the top surface, the top surface being recessed towards the bottom surface to define a cavity in the frame, the LED being received in the cavity, and the bottom surface of the frame being adhered to the printed circuit board; and a lens mounted on the top surface of the frame and covering the LED, an area occupied by a bottom surface of the lens being substantially the same as that occupied by the top surface of the frame, the lens comprising a light adjusting portion and a mounting portion formed on a bottom end of the light adjusting portion, the mounting portion aligned with the top surface and mounted on the top surface, the light adjusting portion facing the LED, a size of the mounting portion being the same as that of the top surface.

8. The light bar of claim 7, wherein the light adjusting portion is convex and protrudes upwardly from a central portion of the mounting portion.

9. The light bar of claim 8, wherein a top surface of the light adjusting portion is convex and acts as a light outputting surface of the lens.

10. The light bar of claim 7, wherein the LED modules are spaced from each other.

11. The light bar of claim 7, wherein an inner surface of the frame defining the cavity is light reflective.

12. The light bar of claim 11, wherein the inner surface of the frame defining the cavity is coated with light reflecting material.

* * * * *